Figure 1:
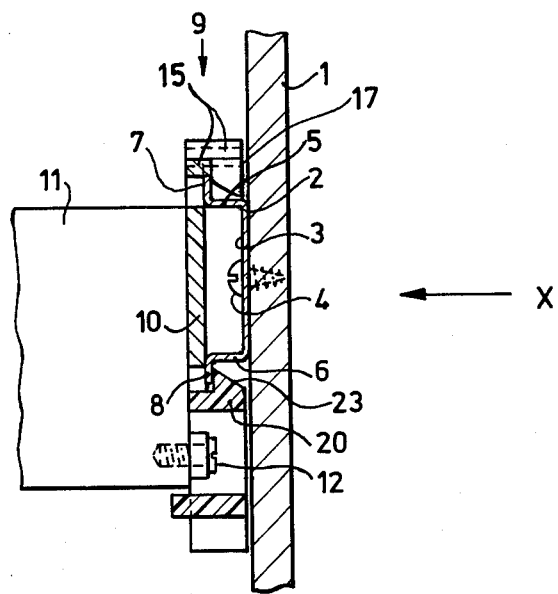

United States Patent [19]

Milcoy

[11] 4,067,529
[45] Jan. 10, 1978

[54] BASE MEMBER FOR ELECTRICAL COMPONENTS

[75] Inventor: Edgar Albert Philip Milcoy, South Milton, England

[73] Assignee: Arrow-Hart (Europe) Limited, Plymouth, England

[21] Appl. No.: 705,574

[22] Filed: July 15, 1976

[30] Foreign Application Priority Data

July 17, 1975 United Kingdom .............. 29999/75

[51] Int. Cl.² ............................................... A47F 5/00
[52] U.S. Cl. ......................... 248/221.4; 339/198 GA; 248/214
[58] Field of Search ................. 248/214, 220.2, 221.3, 248/221.4, 222.1, 295, 298; 339/198 G, 198 GA, 198 K, 198 N

[56] References Cited

U.S. PATENT DOCUMENTS

| 3,236,975 | 2/1966 | De Smidt et al. | 339/198 GA X |
| 3,510,830 | 5/1970 | Wieland | 339/198 GA |
| 3,536,281 | 10/1970 | Meehan et al. | 248/221.4 X |
| 3,552,708 | 1/1971 | Hillstrom | 248/221.3 X |

FOREIGN PATENT DOCUMENTS

| 2,046,344 | 4/1972 | Germany | 248/214 |
| 2,339,905 | 2/1975 | Germany | 339/198 GA |
| 291,016 | 5/1953 | Switzerland | 248/214 |
| 1,050,416 | 12/1966 | United Kingdom | 248/214 |
| 1,395,844 | 5/1975 | United Kingdom | 339/198 GA |

*Primary Examiner*—Lawrence J. Staab
*Attorney, Agent, or Firm*—Davis, Hoxie, Faithfull & Hapgood

[57] ABSTRACT

A base member of an electrical component, which may be attachable to or form part of the component, comprises a plate of synthetic plastics material, for example of nylon or an acetal resin, and a pair of spaced-apart hooking means molded integrally with the plate and adapted to secure the base member to a support, for example a flanged rail of shallow channel section, by entering into hooking engagement with a pair of spaced-apart projections on the support, for example the flanges of said rail. At least one of the hooking means comprises at least one hooking member which is capable of movement towards and away from the other hooking means, this hooking member being urged resiliently towards the other hooking means.

4 Claims, 2 Drawing Figures

U.S. Patent  Jan. 10, 1978  4,067,529

BASE MEMBER FOR ELECTRICAL COMPONENTS

This invention relates to a base member which is attachable to, or forms part of, an electrical component, for example an electrical switch, contactor, latch, tuner or relay.

It is frequently required to fix a plurality of electrical components on a panel or frame and for this purpose it is known to mount an elongate rail of shallow channel section on the frame or panel, this rail having outwardly-directed flanges at the free ends of the limbs of the channel section, the rail being fixed to the frame or panel by screws passing through holes in the web of the channel section.

At the present time, electrical components are then fixed to the rail by one of two methods. In the first of these the electrical components are fixed to the rail using screws, for example self-tapping screws, passing through a base portion of the electrical component and engaged in the flanges of the rail. Such a method of fixing electrical components to the rail is very time-consuming, since it is necessary to drill holes in the rail in a pattern which conforms accurately with the positions of the fixing holes in the base portion of each electrical component to be mounted on the rail. Furthermore, removal of an electrical component from the rail, for the purpose of repair, adjustment or replacement, is also a time-comsuming operation, involving the removal and subsequent replacement of a plurality of screws.

The second method currently used for fixing electrical components to the rail involves providing the components with a fixing plate on which are mounted separately made spring-urged catches which engage the flanges of the rail. These fixing plates, being of a multi-component construction, are expensive to manufacture.

The present invention aims to provide a simplified base member which is attachable to, or forms part of, an electrical component and which can be readily secured to a support, for example a rail of the kind described above.

According to the invention, a base member which is attachable to, or forms part of, an electrical component, comprises a plate of synthetic plastic material and a pair of spaced-apart hooking means moulded integrally with the plate and adapted to secure the base member to a support by entering into hooking engagement with a pair of spaced-apart projections on the support, at least one of said hooking means comprising at least one hooking member which is capable of movement towards and away from the other hooking means, said at least one hooking member being urged resiliently towards said other hooking means.

The preferred material from which the base member is moulded is a thermoplastics material, for example nylon or an acetal resin.

A first one of said hooking means may consist of a single hooking member or a plurality of spaced-apart hooking members moulded integrally with the plate. The second hooking means may then comprise a further hooking member joined to the plate via flexible connecting means so that it is capable of movement towards and away from the first hooking means. The flexible connecting means may consist, for example, of one or more leaf springs moulded integrally with the said further hooking member and said plate and which urge said further hooking member resiliently towards the first hooking means. Alternatively, the second hooking means may comprise a plurality of spaced-apart hooking members joined to the plate by flexible connecting means. Preferably, one of the two hooking means comprises a single hooking member and the other comprises two spaced-apart hooking members.

In an alternative embodiment of the base member according to the invention, both of said hooking means may each comprise one or more hooking members which are movable relative to the plate, both hooking means then being constructed in the manner described above for the second hooking means. It is preferred, however, that only one of the hooking means is constructed in this way.

The base member may comprise means for attaching it to an electrical component, or it may form part of the casing of an electrical component. In either case, it may be provided with holes to enable it to be fixed to a panel with screws or the like fixing members if it is desired, in a particular case, to mount the base member on a panel without employing said hooking means.

Figure 2:
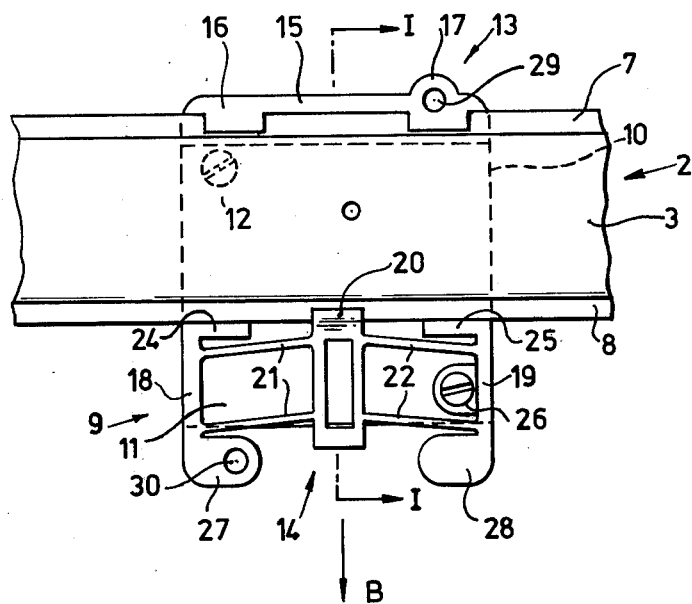

The invention will now be described, by way of example, with reference to the accompanying drawing, in which FIG. 1 is a sectional side view of a base member in accordance with the invention mounted on a rail secured to a panel, the section being taken along the line I—I of FIG. 2, and FIG. 2 is a view taken in the direction of the arrow X in FIG. 1, with the panel omitted.

In the drawing, the numeral 1 designates a panel on which there is secured a rail 2 of shallow channel section. The rail 2 has a web 3 secured to the panel 1 by screws, such as the screw 4, at intervals along its length. The rail 2 has limbs 5, 6 formed integrally with the web 3, and at its free end each of these limbs has an outwardly-directed flange 7, 8, respectively, disposed parallel to the web 3.

The numeral 9 generally designates a base member which in the example illustrated, comprises a generally rectangular plate 10 of thermoplastics material which is attached to the casing 11 of an electrical component, for example an electrical relay, by screws 12.

Two hooking means, generally designated by the numerals 13 and 14, are moulded integrally with the plate 10. The hooking means 13 comprises a rib 15 moulded along one edge of the plate 10 and two spaced-apart hooking members 16, 17 moulded integrally with the rib.

The hooking means 14 comprises two ribs 18, 19 moulded integrally with the plate 10 in spaced-apart, substantially parallel relationship, these two ribs being disposed substantially at right angles to the rib 15. A single hooking member 20 is supported between the ribs 18, 19 by flexible connecting means consisting of four thin blades 21, 22 of plastics material, the two blades 21 being joined at one end to the rib 18 and at the other end to the hooking member 20 and the two blades 22 being joined at one end to the rib 19 and at the other end to the hooking member 20.

The ribs 18, 19, the hooking member 20 and the blades 21, 22 are all moulded integrally with the plate 10.

From FIG. 2 it will be seen that the blades 21 and 22 are not disposed at right angles to the ribs 18, 19 but incline inwardly, at a small angle (for example about 5°), to a plane perpendicular to the plate 10 and to the ribs 18, 19. Normally, the blades 21, 22 hold the hooking member 20 in the position shown in FIG. 2, but the hooking member 20 may be moved in the direction of the arrow B in opposition to the resilience of the blades 21 and 22.

The base member described above is mounted on the rail 2 simply by hooking the hooking members 16 and 17 over the flange 7 of the rail and then pushing the hooking member 20 against the flange 8. A chamfered edge 23 on the hooking member 20 engages the rail flange 8 to urge the hooking member in the direction of the arrow B. The hooking member 20 can then pass the free edge of the flange 8 and the blades 21 and 22 then urge the hooking member into hooking engagement between the flange 8 and the panel 1. In order to remove the base member from the rail, the hooking member 20 is moved in the direction of the arrow B, using a finger, until it is clear of the flange 8. The base member can then be lifted off the rail.

In order to locate the base member firmly in a direction transversely of the longitudinal axis of the rail 2, flanges 24 and 25, parallel to the rib 15, may be secured, for example moulded integrally with, the ribs 18, 19, respectively, the distance between the confronting surfaces of the flanges 24, 25, on the one hand, and the rib 15, on the other hand, being slightly greater than the overall width of the rail 2 measured across the flanges 7, 8. Furthermore, one or more pips (not shown) may be moulded on the surface of the plate 10 in a position to engage against the rail 2 for the purpose of firmly locating the base member on the rail.

In the drawing, the reference numeral 26 designates a lug moulded integrally with the rib 19 for the reception of one of the screws 12 previously referred to. The numerals 27 and 28 designate lugs moulded integrally with the free ends of the ribs 18 and 19, respectively. These lugs serve as supports when it is desired to fix the base member 9 to a panel using screws instead of the hooking means described above. Holes 29 and 30 in the hooking member 17 and the lug 27, respectively, are provided for the reception of such fixing screws.

It will, of course, be appreciated that the base member in accordance with the invention is not limited to the particular embodiment described above with reference to the drawing. Thus, for example, the base plate 10, instead of being attachable to an electrical component, may form part of the casing of an electrical component.

What is claimed is:

1. A base member which is attachable to, or forms part of, an electrical component and which is securable to a support by fastening means engageable with a pair of spaced-apart projections on the support, the base member comprising a plate of synthetic plastic material and said fastening means comprising spaced-apart first and second hooking means moulded integrally with said plate and adapted to enter into hooking engagement with the spaced-apart projections on the support, said second hooking means comprising a hooking member flexibly joined to the plate via flexible connecting means moulded integrally with said plate so that said hooking member is capable of movement in a substantially linear direction towards and away from said first hooking means, said flexible connecting means comprising first and second pairs of resilient blades extending in substantially opposite directions from said hooking member transversely of said linear direction, the blades in each pair of blades being spaced apart in said linear direction.

2. A base member according to claim 1, in which the base member is moulded from thermoplastic material selected from the group consisting of nylon and an acetal resin.

3. A base member according to claim 1, in which said first hooking means consists of at least one hooking member moulded integrally with said plate.

4. A base member according to claim 1, in which said first hooking means comprises two spaced-apart hooking members and said second hooking means comprises a single hooking member.

* * * * *